United States Patent
Kim

(10) Patent No.: US 9,344,072 B2
(45) Date of Patent: May 17, 2016

(54) HIGH-RESOLUTION PULSE WIDTH MODULATION SIGNAL GENERATION CIRCUIT AND METHOD

(71) Applicant: ABOV SEMICONDUCTOR CO., LTD., Seoul (KR)

(72) Inventor: Chang Min Kim, Seoul (KR)

(73) Assignee: ABOV SEMICONDUCTOR CO., LTD., Cheongwon-gun, Chungcheongbuk-do (KR)

( * ) Notice: Subject to any disclaimer, the term of this patent is extended or adjusted under 35 U.S.C. 154(b) by 0 days.

(21) Appl. No.: 14/635,507

(22) Filed: Mar. 2, 2015

(65) Prior Publication Data

US 2015/0171843 A1    Jun. 18, 2015

Related U.S. Application Data

(63) Continuation of application No. PCT/KR2013/007757, filed on Aug. 29, 2013.

(30) Foreign Application Priority Data

Aug. 29, 2012 (KR) .......................... 10-2012-0095088

(51) Int. Cl.
*H03K 3/017* (2006.01)
*H03K 5/05* (2006.01)
*H03K 7/08* (2006.01)
*H03K 5/06* (2006.01)

(52) U.S. Cl.
CPC .. *H03K 5/05* (2013.01); *H03K 5/06* (2013.01); *H03K 7/08* (2013.01)

(58) Field of Classification Search
None
See application file for complete search history.

(56) References Cited

U.S. PATENT DOCUMENTS

| | | | |
|---|---|---|---|
| 5,638,017 A | 6/1997 | Kim | |
| 6,137,337 A | 10/2000 | Beom | |
| 7,459,951 B2 | 12/2008 | Prodic | |
| 7,683,597 B2 | 3/2010 | Shimada et al. | |
| 7,919,932 B2 | 4/2011 | Lim et al. | |
| 2004/0146101 A1* | 7/2004 | Pearce | H02M 3/157 375/238 |

FOREIGN PATENT DOCUMENTS

| | | |
|---|---|---|
| KR | 10-1997-0008876 A | 2/1997 |
| KR | 10-0151261 B1 | 6/1998 |
| KR | 10-0254858 B1 | 5/2000 |
| KR | 10-2004-0021270 A | 3/2004 |
| KR | 10-2006-0126035 A | 12/2006 |
| KR | 10-2008-0030928 A | 4/2008 |
| KR | 10-0922846 B1 | 10/2009 |
| WO | 2007-101014 A2 | 9/2007 |

* cited by examiner

*Primary Examiner* — Cassandra Cox
(74) *Attorney, Agent, or Firm* — Mintz Levin Cohn Ferris Glovsky and Popeo, P.C.; Kongsik Kim

(57) ABSTRACT

A pulse width modulation (PWM) signal generation circuit and method are disclosed herein. The PWM signal generation circuit includes an integer part pulse generation circuit, and a fractional part pulse generation circuit. The integer part pulse generation circuit generates an integer part pulse using the integer part of the digitized value of a duty cycle, i.e., the ratio of the time during which any one of high and low levels is maintained to the period of a PWM signal. The fractional part pulse generation circuit generates the PWM signal using the integer part pulse and the fractional part of the digitized value of the duty cycle.

13 Claims, 11 Drawing Sheets

HIGH-RESOLUTION PULSE WIDTH MODULATION SIGNAL GENERATION CIRCUIT AND METHOD

CROSS-REFERENCE TO RELATED APPLICATION

This application is a continuation of PCT/KR2013/007757 filed on Aug. 29, 2013, which claims priority to Korean Application No. 10-2012-0095088 filed on Aug. 29, 2012, which application is incorporated herein by reference.

TECHNICAL FIELD

The present invention relates to a high-resolution pulse width modulation (PWM) signal generation circuit and method and, more particularly, to a circuit and method that provide a delay array corresponding to a 0.5 clock time period and generate high-resolution PWM signals.

BACKGROUND ART

PWM signals are being used in various fields, including the fields of motor control, power electronic control, light-emitting diode (LED) driving, etc. Among these PWM signals, PWM signals used in the field of power electronics are used chiefly in power supplies, and are used to control switching devices to generate target voltages. Recently, in response to the demands for the small size, high performance and high functionality of power supplies, the digital control of power supplies has been employed instead of a conventional analog control method.

In power supplies that are digitally controlled, a method of generating a PWM signal using a counter and a comparison circuit is used. More specifically, a value is counted up by inputting a clock signal into the counter, and the count value and a threshold value are compared with each other by inputting them to the comparison circuit, thereby generating a PWM signal. The counter is reset when a reset value set to a value larger than the threshold value is reached. The duty (logic "H" time ratio) of the PWM signal is changed by changing the threshold value, and the period of the PWM signal is changed by changing the reset value.

However, in the conventional technology, even when the threshold value is changed by only 1 in order to minutely change the duty cycle, the logic "H" time of the PWM signal is changed by one clock period. Accordingly, since the minimum unit of a change in duty cycle is large, it is difficult to minutely control the output power of a power supply and also it is impossible to construct a high-performance power supply. Moreover, control is performed chiefly using a low-resolution PWM signal and an analog feedback circuit together, and thus a problem arises in that it is difficult to generate a high-resolution PWM signal.

In order to solve the above-described problems, Korean Patent Application Publication No. 2008-0030928 discloses a PWM signal generation circuit and a power supply including the same. This technology is intended to provide a method of controlling the duty of a PWM signal that is capable of reducing the variation in duty cycle without increasing clock frequency. However, although this technology improves the resolution of a PWM signal over a wide duty cycle range by arbitrarily changing both the period and logic "H" time of an output PWM signal at time intervals of ½ of a clock period, it is difficult to generate a high-resolution PWM signal because there is no process of forming a control loop using only a PWM signal.

SUMMARY OF THE DISCLOSURE

Accordingly, the present invention has been made keeping in mind the above problems occurring in the prior art, and an object of the present invention is to provide a high-resolution PWM signal generation circuit and method using a buffer device, as a basic circuit that is commonly used.

A buffer device exhibits variations in delay. That is, a buffer device may have a time delay of several pico seconds in a fine process, and may have a time delay of hundreds of seconds in some processes. Although a buffer circuit can be easily implemented because it has a simple structure, it is disadvantageous in that its time delay value significantly varies depending on a change in process or temperature. Accordingly, a desired PWM duty may not be achieved, and thus system performance may be degraded.

In order to overcome the above disadvantage, an object of the present invention is to provide a PWM signal generation circuit and method that monitor the variation in delay attributable to a change in process or temperature, compensate for the variation in accordance with a desired duty value, detect the occurrence of an overflow, and then provide a desired high-resolution duty without abnormality.

In accordance with the above-described object, the present invention is configured to construct a delay array corresponding to a 0.5 clock time period, to generate a high-resolution PWM signal, to sample the PWM signal using a clock signal, and to then perform a supplementary process, thereby implementing a duty value having a desired high resolution. The present invention includes the supplementary process of determining whether to use the HIGH or LOW portion of the clock signal by measuring the overflow of delay obtained from the array. Accordingly, although the delay array is constructed for the time corresponding to a 0.5 clock time unit, the variation in the time delay of a delay device can be compensated for because the occurrence of an overflow is continuously checked.

In order to achieve the above-described object, a high-resolution PWM generation apparatus in accordance with an embodiment of the present invention includes an integer part pulse generation circuit, and a fractional part pulse generation circuit.

The integer part pulse generation circuit generates an integer part pulse using the integer part of the digitized value of a duty cycle. In this case, the integer part pulse generation circuit may include a counter configured to increase the digital value of the output signal based on a clock; a comparator configured to compare the integer part with the digital value of the output signal of the counter, and output a comparison signal; and a sampling circuit configured to generate the integer part pulse by sampling the comparison signal at a rising or falling edge of the clock.

The fractional part pulse generation circuit generates a PWM signal using the integer part pulse and the fractional part of the digitized value of the duty cycle. In this case, the fractional part pulse generation circuit may include a delay chain circuit configured to receive the integer part pulse as an input, and output a plurality of delay signals; a decoding circuit configured to select any one from among the plurality of delay signals using the fractional part, and output the selected delay signal; and a first logic circuit configured to generate the PWM signal using the integer part pulse and the output signal of the decoding circuit.

Accordingly, the delay array is constructed for the time corresponding to a 0.5 clock period, sampling is performed at the rising and falling edges of a clock, the overflow of the delay array is measured in real time, and then the time delay of the delay device is compensated for.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE DISCLOSURE

Hereinafter, embodiments of the present invention will be described in detail with reference to the accompanying drawings. In the following description, detailed descriptions of related well-known components or functions that may unnecessarily make the gist of the present invention obscure will be omitted.

However, the present invention is not limited to these embodiments. Throughout the drawings, the same reference symbols denote the same components.

Figure 1:
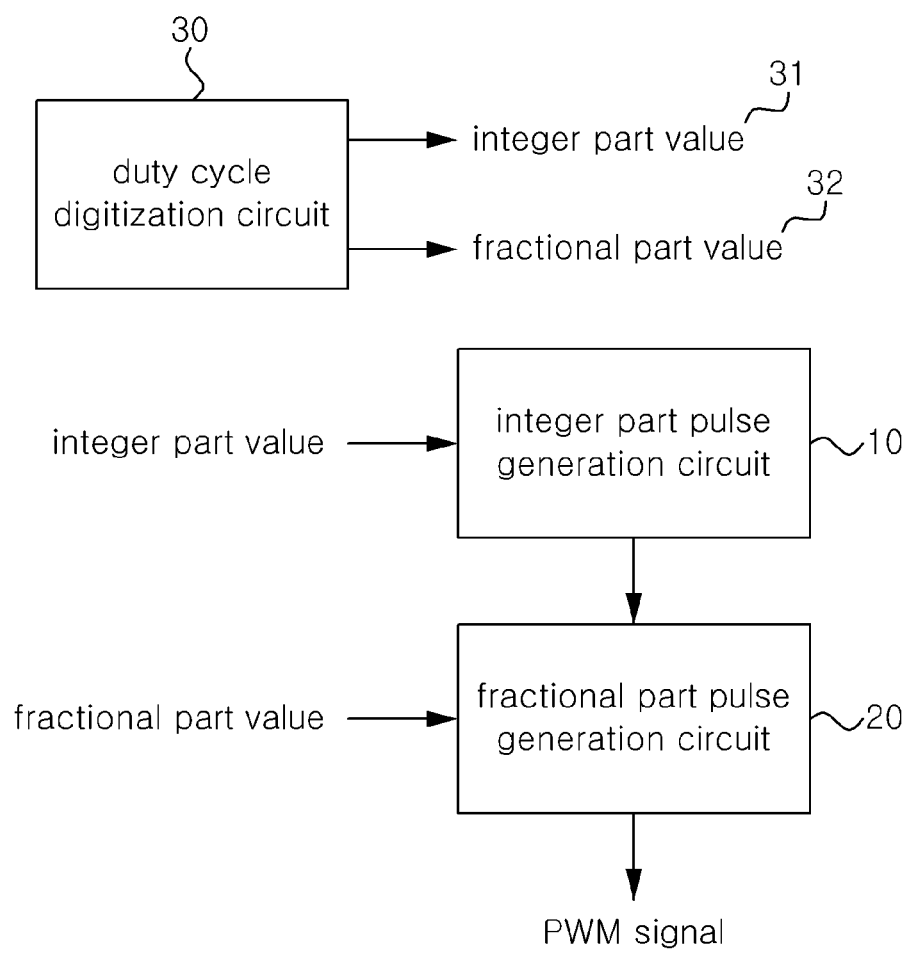
FIG. 1 illustrates the structure of a high-resolution PWM generation apparatus in accordance with an embodiment of the present invention.

FIG. 1 illustrates the structure of a high-resolution PWM generation apparatus in accordance with an embodiment of the present invention.

The high-resolution PWM generation apparatus includes an integer part pulse generation circuit 10 and a fractional part pulse generation circuit 20.

The integer part pulse generation circuit 10 generates an integer part pulse using the integer part 31 of the digitized value of the duty cycle, i.e., the ratio of the time during which any one of high and low levels is maintained to the period of a PWM signal, and transfers the generated integer part pulse to the fractional part pulse generation circuit 20.

The fractional part pulse generation circuit 20 generates a PWM signal using the integer part pulse and the fractional part of the digitized value of the duty cycle.

In this case, the high-resolution PWM generation apparatus may further include a duty cycle digitization circuit 30 that generates the digitized value of the duty cycle by digitizing a value obtained by multiplying the ratio between the period of the PWM signal and the period of the clock by the duty cycle and then generates the integer and fractional parts of the digitized value of the duty cycle.

Figure 2:
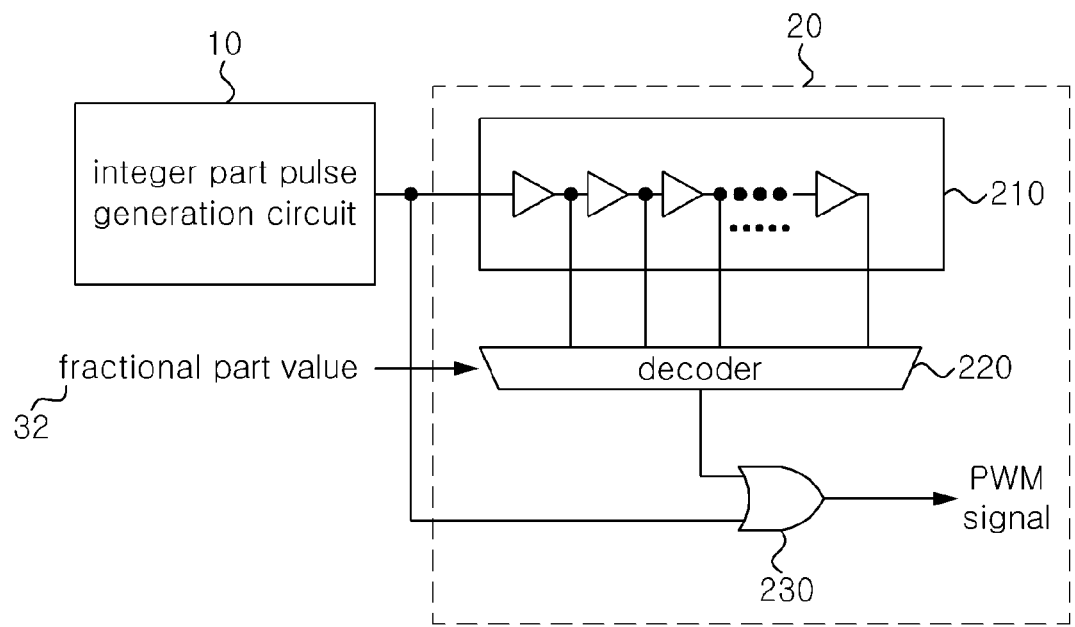
FIG. 2 illustrates a structure that generates a high-resolution PWM signal using an integer part pulse and a fractional part in a high-resolution PWM generation apparatus in accordance with an embodiment of the present invention.

FIG. 2 illustrates a structure that generates a high-resolution PWM signal using an integer part pulse and a fractional part in a high-resolution PWM generation apparatus in accordance with an embodiment of the present invention.

The fractional part pulse generation circuit 20 includes a delay chain circuit 210, a decoding circuit 220, and a first logic circuit 230.

The delay chain circuit 210 receives an integer part pulse, generated by the integer part pulse generation circuit 10, as an input, and outputs a plurality of delay signals using the integer part pulse.

The decoding circuit 220 selects any one from among the plurality of delay signals, output by the delay chain circuit 210, using the fractional part 32 of the digitized value of the duty cycle generated by digitizing a value obtained by multiplying the ratio between the period of the PWM signal and the period of the clock by the duty cycle, and then outputs the selected signal.

The first logic circuit 230 generates a PWM signal using an output signal that is selected from among the integer part pulse generated by the integer part pulse generation circuit 10 and the plurality of delay signals of the decoding circuit 220 and is then output.

Figure 3:
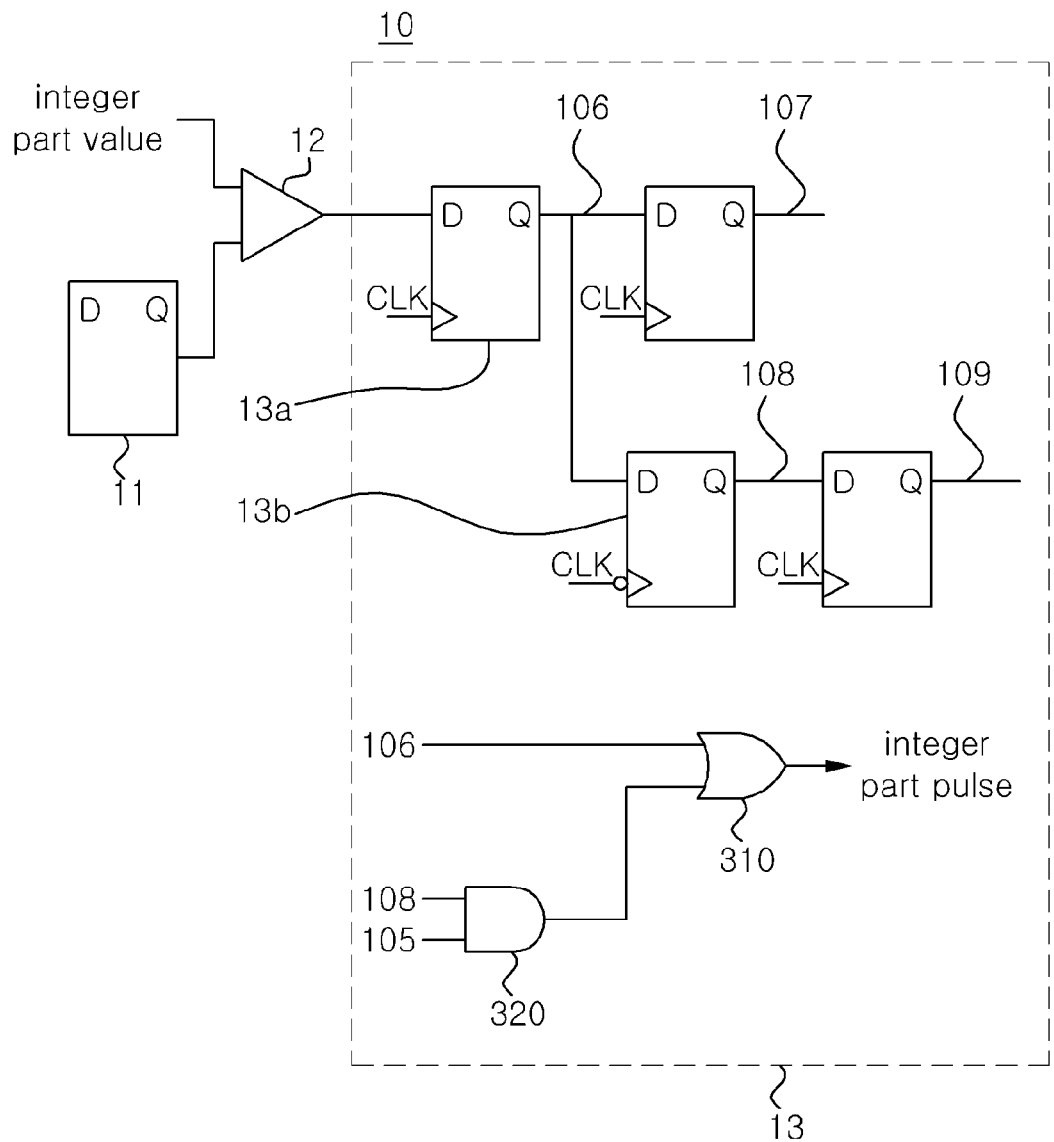
FIG. 3 illustrates a structure that generates an integer part pulse in a high-resolution PWM generation apparatus in accordance with an embodiment of the present invention.

FIG. 3 illustrates a structure that generates an integer part pulse in a high-resolution PWM generation apparatus in accordance with an embodiment of the present invention.

The integer part pulse generation circuit 10 includes a counter 11, a comparator 12, and a sampling circuit 13.

The counter 11 functions to increase the digital value of an output signal based on a clock. The digital value of the output signal may be increased in preset order or according to the input of a user.

The comparator 12 compares an integer part with the digital value of the output signal based on the clock of the counter 11, and outputs a comparison signal.

The sampling circuit 13 generates an integer part pulse by sampling the comparison signal, output by the comparator 12, at the rising or falling edge of a clock in the output signal of the counter 11.

In this case, the sampling circuit 13 includes a rising edge sampling circuit 13a, a falling edge sampling circuit 13b, and second logic circuits 310 and 320.

The rising edge sampling circuit 13a generates a rising edge integer part pulse 106 by sampling the comparison signal at the rising edge of a clock output by the counter 11, while the falling edge sampling circuit 13b generates a falling edge integer part pulse 108 by sampling the rising edge integer part pulse 106 at the falling edge of the clock output by the counter 11.

The second logic circuits 310 and 320 generates an integer part pulse from at least one of the rising edge integer part pulse 106 and the falling edge integer part pulse 108 based on the size 105 of the fractional part of the digitized value of the duty cycle.

Figure 4:
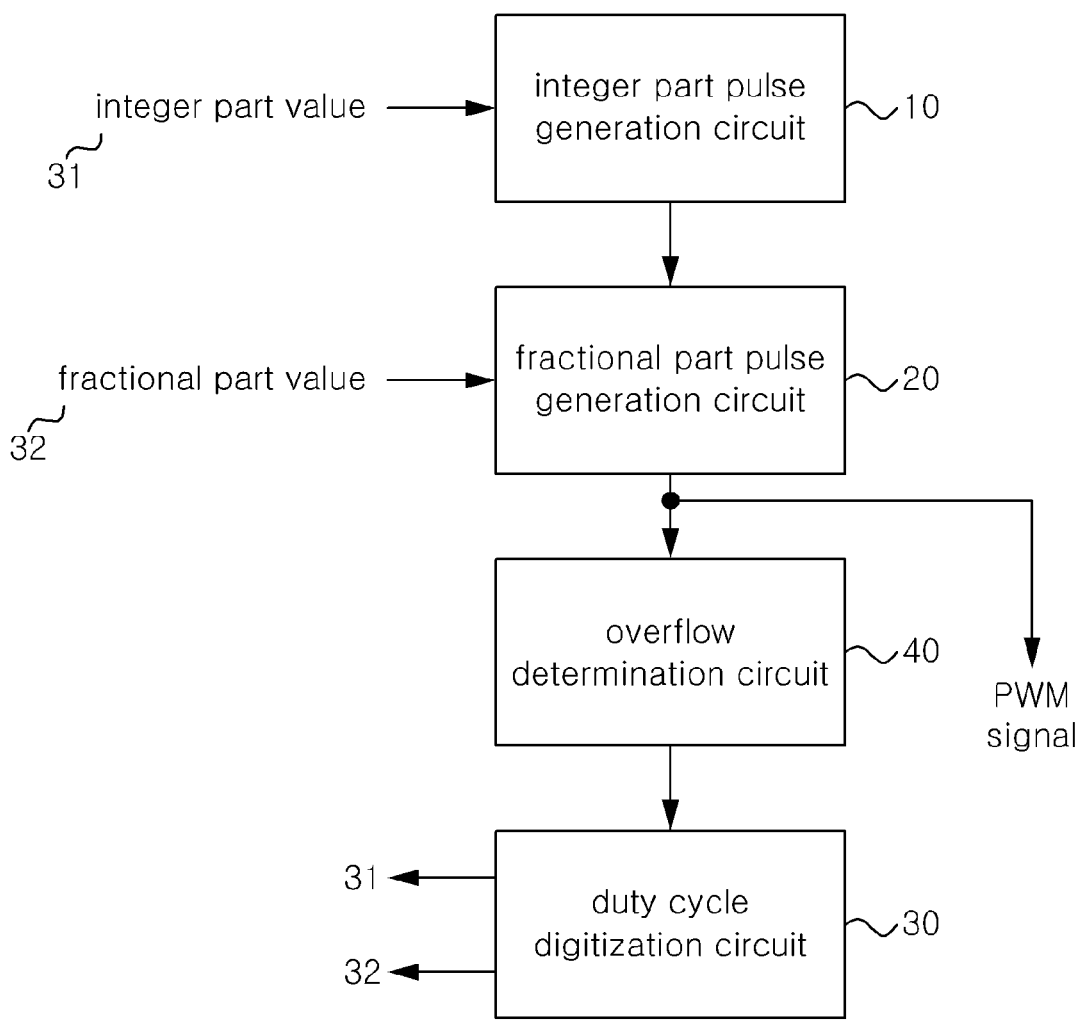
FIG. 4 illustrates a structure that generates a high-resolution PWM signal based on an overflow determination circuit in a high-resolution PWM generation apparatus in accordance with an embodiment of the present invention.

FIG. 4 illustrates a structure that generates a high-resolution PWM signal based on an overflow determination circuit in a high-resolution PWM generation apparatus in accordance with an embodiment of the present invention.

Since an integer part pulse generation circuit 10 and a fractional part pulse generation circuit 20 illustrated in FIG. 4 are the same as the integer part pulse generation circuit 10 and the fractional part pulse generation circuit 20 described in conjunction with FIG. 1, descriptions thereof are omitted.

The overflow determination circuit 40 receives the PWM signal generated by the fractional part pulse generation circuit 20, and generates a signal, indicating that an overflow has occurred, if the length of a pulse portion extended as a result of the incorporation of the fractional part 32 into the PWM signal is equal to or longer than a 0.5 clock.

Thereafter, the generated overflow signal is transferred to the duty cycle digitization circuit 30. The duty cycle digitization circuit 30 generates the digitized value of the duty cycle by digitizing a value by multiplying the ratio between the period of the PWM signal and the period of the clock by the duty cycle using the received overflow signal, and then generates the integer part of the digitized value of the duty cycle and the fractional part.

Figure 5:
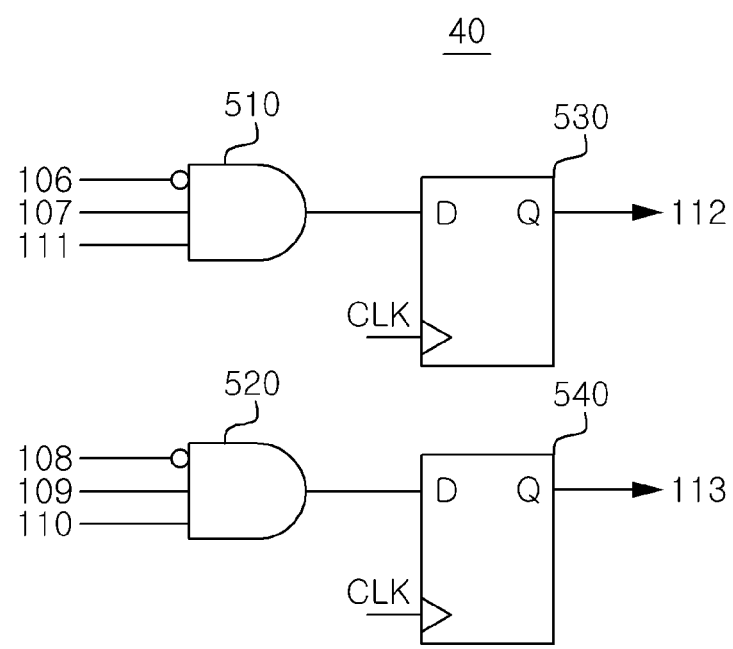
FIG. 5 illustrates the structure of an overflow determination circuit in accordance with an embodiment of the present invention.

FIG. 5 illustrates the structure of an overflow determination circuit in accordance with an embodiment of the present invention.

The overflow determination circuit 40 includes a first AND gate 510, a second AND gate 520, a first flip-flop 530, and a second flip-flop 540.

The first AND gate 510 receives the rising edge integer part pulse 106 output by the rising edge sampling circuit 13a, a signal 107 obtained by delaying the rising edge integer part pulse 106 by one clock, and a signal 111 sampled at the rising edge of the clock output by the delay chain circuit 210.

In this case, the rising edge integer part pulse 106 is inverted and then received.

The first flip-flop 530 receives signals via the first AND gate 510, and generates an overflow signal indicating that a 0.5 or higher duty occurs when the HIGH portion of the clock is used based on the clock output by the counter 11.

The second AND gate 520 receives the falling edge integer part pulse 108, a signal 109 obtained by delaying the falling edge integer part pulse 108 by one clock, and a signal 111 sampled at the falling edge of the clock output by the delay chain circuit 210.

In this case, the falling edge integer part pulse 108 is inverted and then received.

The second flip-flop 540 receives signals via the second AND gate 520, and generates an overflow signal indicating that a 1.0 or higher duty occurs when the LOW portion of the clock is used based on the clock output by the counter 11.

Figure 6:
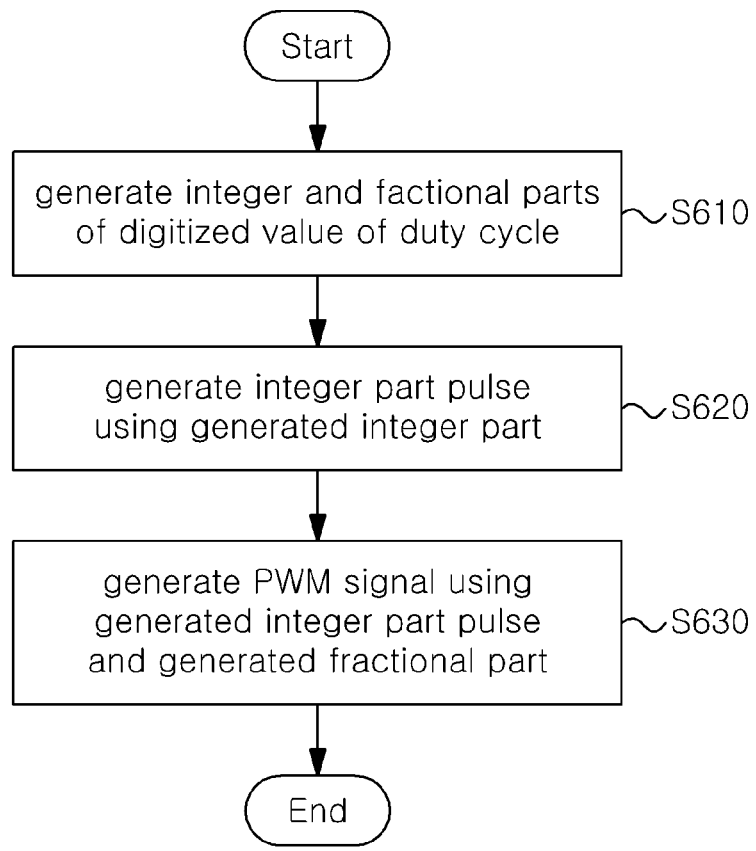
FIG. 6 is a flowchart of a high-resolution PWM signal generation method in accordance with an embodiment of the present invention.

FIG. 6 is a flowchart of a high-resolution PWM signal generation method in accordance with an embodiment of the present invention.

The duty cycle digitization circuit 30 generates the integer and fractional parts of the digitized value of a duty cycle, i.e., the ratio of the time during which any one of high and low levels is maintained to the period of a PWM signal, at step S610.

In this case, the digitized value of the duty cycle is generated by digitizing a value obtained by multiplying the ratio between the period of the PWM signal and the period of the clock by the duty cycle, and then the integer and fractional parts of the digitized value of the duty cycle are generated.

The integer part pulse generation circuit 10 generates an integer part pulse using the integer part of the digitized value of the duty cycle, i.e., the ratio of the time during which any one of high and low levels is maintained to the period of a PWM signal, at step S620.

The fractional part pulse generation circuit 20 generates a PWM signal using the integer part pulse and the fractional part of the digitized value of the duty cycle at step S630.

Figure 7:
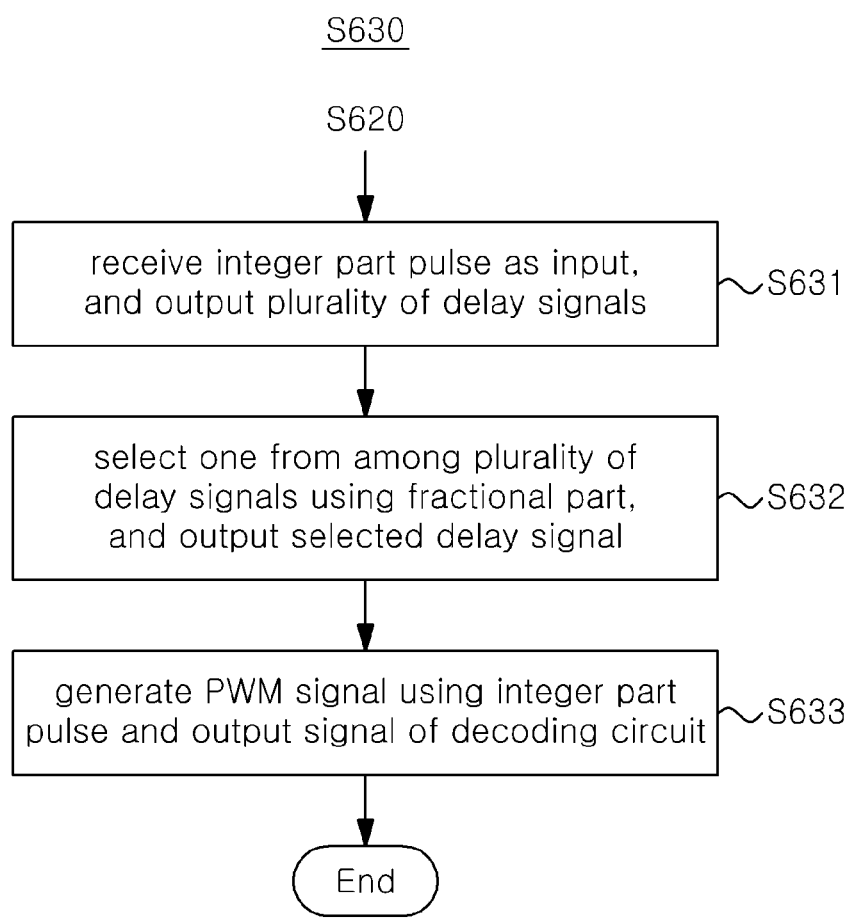
FIG. 7 is a flowchart of the generation of a PWM signal using an integer part pulse and a fractional part in accordance with an embodiment of the present invention.

FIG. 7 is a flowchart of the generation of a PWM signal using an integer part pulse and a fractional part in accordance with an embodiment of the present invention.

In step S630 of generating a PWM signal, an integer part pulse is received as an input and then a plurality of delay signals is output at the delay chain circuit 210 at step S631. Thereafter, any one of the plurality of delay signals is selected using the fractional part 32 and then output at step S632, and a PWM signal is generated using the integer part pulse and the output signal of the decoding circuit 220 at step S633.

Figure 8:
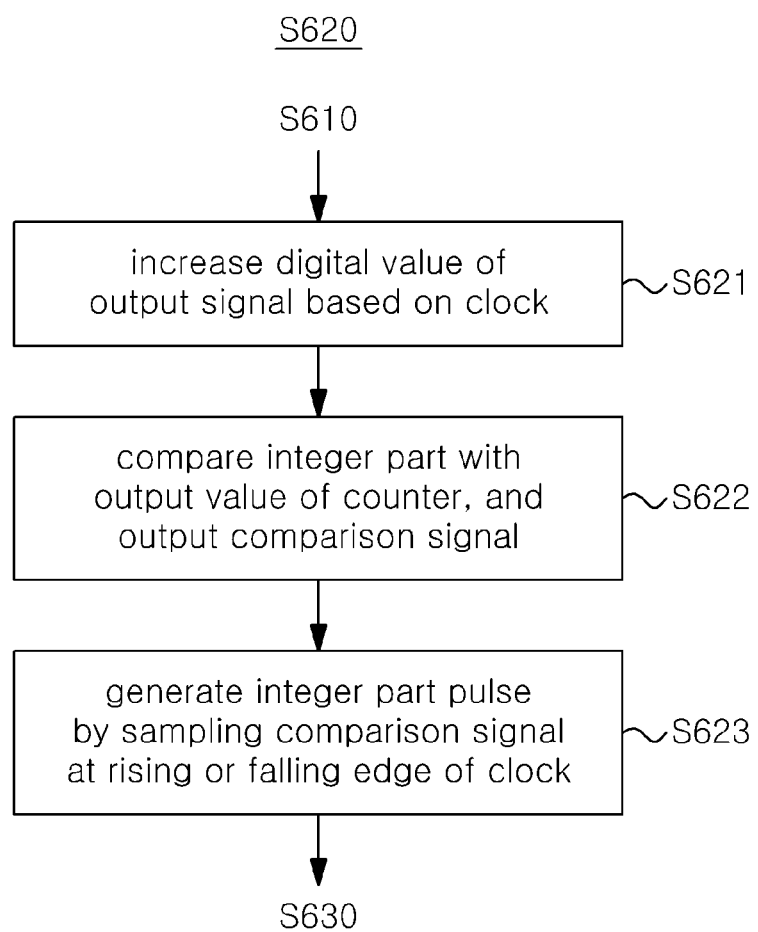
FIG. 8 is a flowchart of the generation of an integer part pulse in accordance with an embodiment of the present invention.

FIG. 8 is a flowchart of the generation of an integer part pulse in accordance with an embodiment of the present invention.

In step S620 of generating an integer part pulse, the digital value of an output signal is increased in accordance with a clock at counter 11 at step S621. Thereafter, the integer part 31 is compared with the digital value of the output signal of the counter 11 by the comparator 12 and then a comparison signal is output at step S622. An integer part pulse is generated by sampling the comparison signal, output by the comparator 12, at the rising or falling edge of the clock output by the counter 11 at step S623.

Figure 9:
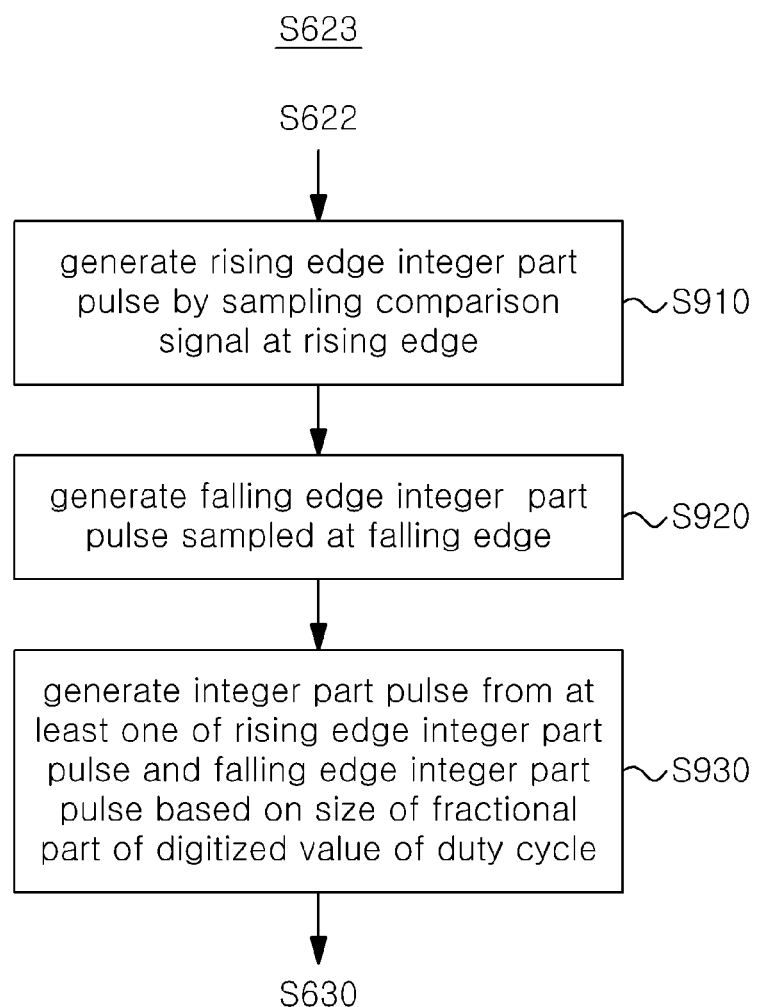
FIG. 9 is a flowchart related to a sampling circuit that generates an integer part pulse in accordance with an embodiment of the present invention.

FIG. 9 is a flowchart related to a sampling circuit that generates an integer part pulse in accordance with an embodiment of the present invention.

In step S623 of generating an integer part pulse through sampling, which is illustrated in FIG. 8, the integer part pulse is generated by sampling the comparison signal, output by the comparator 12, at the rising or falling edge of the clock output by the counter 11 at step S910.

Furthermore, the falling edge integer part pulse 108 is generated by sampling the rising edge integer part pulse 106 at the falling edge of the clock at step S920. The integer part pulse is generated from at least one of the rising edge integer part pulse 106 and the falling edge integer part pulse 108 based on the size of the digitized value of the duty cycle fractional part 32 at step S930.

Figure 10:
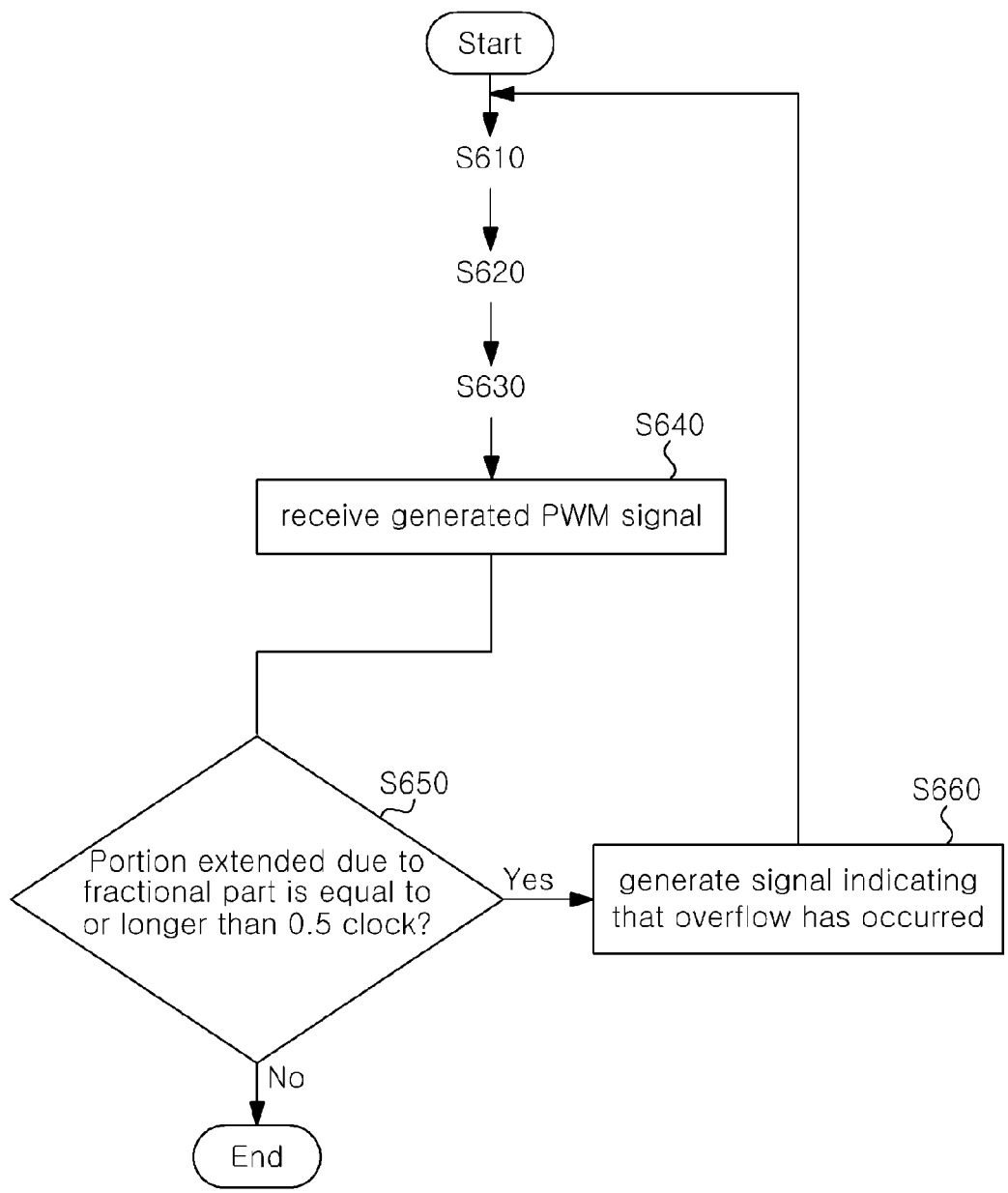
FIG. 10 is a flowchart of the occurrence of an overflow in a high-resolution PWM generation apparatus in accordance with an embodiment of the present invention.

FIG. 10 is a flowchart of the occurrence of an overflow in a high-resolution PWM generation apparatus in accordance with an embodiment of the present invention.

The duty cycle digitization circuit 30 generates the integer and fractional parts of the digitized value of the duty cycle, i.e., the ratio of the time during which any one of high and low levels is maintained to the period of a PWM signal, at step S610.

In this case, the digitized value of the duty cycle is generated by digitizing a value obtained by multiplying the ratio between the period of the PWM signal and the period of the clock by the duty cycle, and then the integer and fractional parts of the digitized value of the duty cycle are generated.

The integer part pulse generation circuit 10 generates an integer part pulse using the integer part of the digitized value of the duty cycle, i.e., the ratio of the time during which any one of high and low levels is maintained to the period of a PWM signal, at step S620.

The fractional part pulse generation circuit 20 generates a PWM signal using the integer part pulse and the fractional part of the digitized value of the duty cycle at step S630.

In this case, the overflow determination circuit 40 receives the generated PWM signal at step S640. Thereafter, it is determined whether a pulse portion extended due to the fractional part 32 is equal to or longer than a 0.5 clock at step S650. If the pulse portion is equal to or longer than a 0.5 clock 0.5, a signal indicating that an overflow has occurred is generated and transferred to the duty cycle digitization circuit 30 at step S660.

Figure 11:
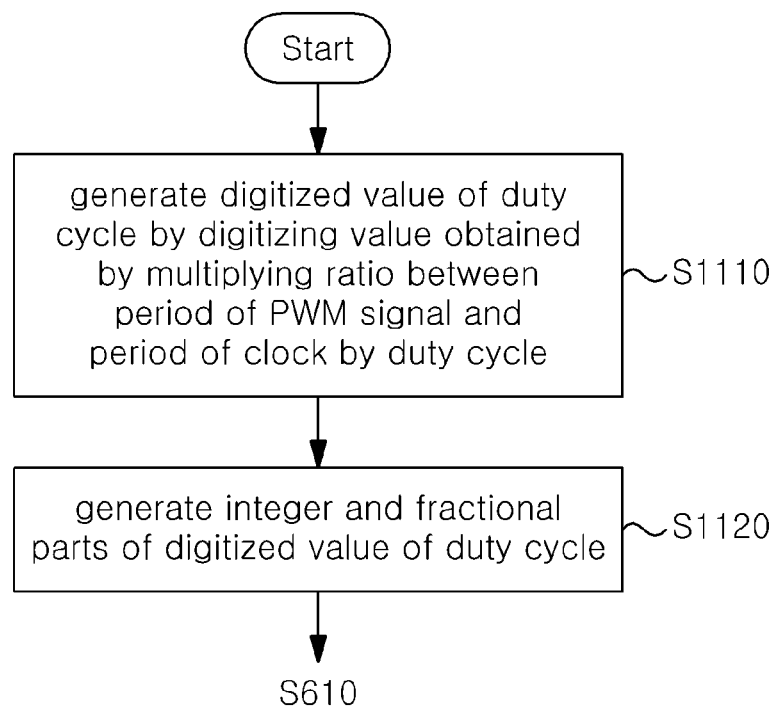
FIG. 11 is a flowchart of the generation of the digitized value of a duty cycle in accordance with an embodiment of the present invention.

FIG. 11 is a flowchart of the generation of the digitized value of a duty cycle in accordance with an embodiment of the present invention.

The duty cycle digitization circuit 30 generates the digitized value of the duty cycle by digitizing a value by multiplying the ratio between the period of the PWM signal and the period of the clock by the duty at step S1110, and then generates the integer part of the digitized value of the duty cycle and the fractional part at step S1120.

In this case, when the overflow signal received from the overflow determination circuit 40 is received, the integer part of the digitized value of the duty cycle and the fractional part are generated using the overflow signal.

The present invention is advantageous in that the present invention is not sensitive to noise and also a high-resolution PWM signal can be output using a very small area because the present invention is constructed using only digital devices that are commonly used.

Furthermore, the present invention is advantageous in that a PWM signal having a pico-level resolution can be easily generated because the time delay of a unit device is significantly reduced in the case of a fine process and in that functions, such as power electronics, LED driving, etc., can be implemented using a single chip because a multi-channel high-resolution PWM configuration can be easily achieved.

A high-resolution PWM signal generation method in accordance with an embodiment of the present invention may be implemented in the form of program instructions that can be executed by a variety of computer means, and may be stored in a computer-readable storage medium. The computer-readable storage medium may include program instructions, a data file, and a data structure solely or in combination. The program instructions that are stored in the medium may be designed and constructed particularly for the present invention, or may be known and available to those skilled in the field of computer software. Examples of the computer-readable storage medium include magnetic media such as a hard disk, a floppy disk and a magnetic tape, optical media such as CD-ROM and a DVD, magneto-optical media such as a floptical disk, and hardware devices particularly configured to store and execute program instructions such as ROM, RAM, and flash memory. Examples of the program instructions include not only machine language code that is constructed by a compiler but also high-level language code that can be executed by a computer using an interpreter or the like. The above-described hardware components may be configured to act as one or more software modules that perform the operation of the present invention, and vice versa.

While the present invention has been described in conjunction with specific details, such as specific configuration elements, and limited embodiments and diagrams above, these are provided merely to help an overall understanding of the present invention, the present invention is not limited to these embodiments, and various modifications and variations can be made from the above description by those having ordinary knowledge in the art to which the present invention pertains.

Therefore, the technical spirit of the present invention should not be determined based on only the described embodiments, and the following claims, all equivalent to the claims and equivalent modifications should be construed as falling within the scope of the spirit of the present invention.

The present invention relates to a high-resolution PWM signal generation circuit and method and, more particularly, to a circuit and method that provide a delay array corresponding to a 0.5 clock time period and generate high-resolution PWM signals.

The present invention is configured to construct a delay array corresponding to a 0.5 clock time period, to generate a high-resolution PWM signal, to sample the PWM signal using a clock signal, and to determine whether to use the HIGH or LOW portion of the clock signal by measuring an overflow. Accordingly, the delay array is constructed for the time corresponding to a 0.5 clock time, and the time delay of the delay device can be compensated for because the occurrence of an overflow is continuously checked.

What is claimed is:

1. A pulse width modulation (PWM) signal generation circuit, comprising:
   an integer part pulse generation circuit configured to generate an integer part pulse using an integer part of a digitized value of a duty cycle, which is a ratio of a time during which any one of high and low levels is maintained to a period of a PWM signal; and
   a fractional part pulse generation circuit configured to generate the PWM signal using the integer part pulse and a fractional part of the digitized value of the duty cycle.

2. The PWM signal generation circuit of claim 1, wherein the fractional part pulse generation circuit comprises:
   a delay chain circuit configured to:
      receive the integer part pulse as an input, and
      output a plurality of delay signals;
   a decoding circuit configured to:
      select one from among the plurality of delay signals using the fractional part, and
      output the selected delay signal; and
   a first logic circuit configured to generate the PWM signal using the integer part pulse and the output signal of the decoding circuit.

3. The PWM signal generation circuit of claim 1, wherein the integer part pulse generation circuit comprises:
   a counter configured to increase a digital value of the output signal based on a clock;
   a comparator configured to:
      compare the integer part with the digital value of the output signal of the counter, and
      output a comparison signal; and
   a sampling circuit configured to generate the integer part pulse by sampling the comparison signal at a rising or falling edge of the clock.

4. The PWM signal generation circuit of claim 3, wherein the sampling circuit comprises:
   a rising edge pulse generation circuit configured to generate a rising edge integer part pulse by sampling the comparison signal at the rising edge of the clock;
   a falling edge pulse generation circuit configured to generate a falling edge integer part pulse by sampling the rising edge integer part pulse at the falling edge of the clock; and
   a second logic circuit configured to generate the integer part pulse from at least one of the rising edge integer part pulse and the falling edge integer part pulse based on a size of the fractional part of the digitized value of the duty cycle.

5. The PWM signal generation circuit of claim 1, further comprising:
   an overflow determination circuit configured to:
      receive the generated PWM signal, and generate a signal, indicating that an overflow has occurred, if a length of a pulse portion extended as a result of incorporation of the fractional part into the PWM signal is equal to or longer than a 0.5 clock.

6. The PWM signal generation circuit of claim 1, further comprising:
a duty cycle digitization circuit configured to:
generate the digitized value of the duty cycle by digitizing a value obtained by multiplying a ratio between a period of the PWM signal and a period of the clock by the duty cycle, and
generate the integer and fractional parts of the digitized value of the duty cycle.

7. A PWM signal generation method, comprising:
generating an integer part pulse using an integer part of a digitized value of a duty cycle, which is a ratio of a time during which any one of high and low levels is maintained to a period of a PWM signal; and
generating the PWM signal using the integer part pulse and a fractional part of the digitized value of the duty cycle.

8. The PWM signal generation method of claim 7, wherein generating the PWM signal comprises:
receiving the integer part pulse as an input, and outputting a plurality of delay signals;
selecting any one from among the plurality of delay signals using the fractional part, and outputting the selected delay signal; and
generating the PWM signal using the integer part pulse and the output selected delay signal.

9. The PWM signal generation method of claim 7, wherein generating the integer part pulse comprises:
increasing a digital value of the output selected delay signal based on a clock;
comparing the integer part with the digital value of the output signal of the counter, and outputting a comparison signal; and
generating the integer part pulse by sampling the comparison signal at a rising or falling edge of the clock.

10. The PWM signal generation method of claim 9, wherein generating the integer part pulse by sampling the comparison signal at the rising or falling edge of the clock comprises:
generating a rising edge integer part pulse by sampling the comparison signal at the rising edge of the clock;
generating a falling edge integer part pulse by sampling the rising edge integer part pulse at the falling edge of the clock; and
generating the integer part pulse from at least one of the rising edge integer part pulse and the falling edge integer part pulse based on a size of the fractional part of the digitized value of the duty cycle.

11. The PWM signal generation method of claim 7, further comprising:
receiving the generated PWM signal, and generating a signal, indicating that an overflow has occurred, if a length of a pulse portion extended as a result of incorporation of the fractional part into the PWM signal is equal to or longer than a 0.5 clock.

12. The PWM signal generation method of claim 7, further comprising:
generating the digitized value of the duty cycle by digitizing a value obtained by multiplying a ratio between a period of the PWM signal and a period of the clock by the duty cycle, and generating the integer and fractional parts of the digitized value of the duty cycle.

13. A non-transitory computer-readable storage medium having stored therein computer-readable program instructions that, when executed by a controller of a PWM generation circuit, cause the PWM generation circuit to:
generate an integer part pulse using an integer part of a digitized value of a duty cycle, which is a ratio of a time during which any one of high and low levels is maintained to a period of a PWM signal; and
generate the PWM signal using the integer part pulse and a fractional part of the digitized value of the duty cycle.

* * * * *